(12) United States Patent
Yoshinaga et al.

(10) Patent No.: US 11,574,188 B2
(45) Date of Patent: Feb. 7, 2023

(54) DATA PROCESSING APPARATUS, DATA PROCESSING METHOD, MEDIUM, AND TRAINED MODEL

(71) Applicant: CANON KABUSHIKI KAISHA, Tokyo (JP)

(72) Inventors: Motoki Yoshinaga, Yokohama (JP); Tsewei Chen, Tokyo (JP); Masami Kato, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 288 days.

(21) Appl. No.: 16/810,057

(22) Filed: Mar. 5, 2020

(65) Prior Publication Data
US 2020/0293885 A1    Sep. 17, 2020

(30) Foreign Application Priority Data

Mar. 11, 2019    (JP) .............................. JP2019-044190

(51) Int. Cl.
*G06N 3/08*    (2006.01)
*H03M 7/30*    (2006.01)

(52) U.S. Cl.
CPC ............ *G06N 3/08* (2013.01); *H03M 7/3059* (2013.01)

(58) Field of Classification Search
CPC ............ H04L 29/06; H04L 9/06; H03M 7/46; H03M 7/3059; H03M 7/607; H03M 7/6094; H03M 7/305; H03M 7/609; G06N 3/063; G06N 3/08
See application file for complete search history.

(56) References Cited

U.S. PATENT DOCUMENTS

| | | | | |
|---|---|---|---|---|
| 5,142,666 | A * | 8/1992 | Yoshizawa | G06N 3/04 706/38 |
| 7,539,549 | B1 * | 5/2009 | Discenzo | G05B 23/024 702/183 |
| 8,885,930 | B2 | 11/2014 | Yamamoto et al. | |

(Continued)

FOREIGN PATENT DOCUMENTS

JP    2018010618 A    1/2018

OTHER PUBLICATIONS

Y. Chen et al., "Eyeriss: An Energy-Efficient Reconfigurable Accelerator for Deep Convolutional Neural Networks," in IEEE Journal of Solid-State Circuits, vol. 52, No. 1, pp. 1-12, Jan. 2017., doi: 10.1109/JSSC.2016.2616357.

*Primary Examiner* — Wei Zhao
(74) *Attorney, Agent, or Firm* — Carter, DeLuca & Farrell LLP

(57) ABSTRACT

There is provided with a data processing apparatus. An acquisition unit acquires feature plane data of a layer included in a neural network. A control unit outputs a first control signal corresponding to the layer for controlling first compression processing and a second control signal corresponding to the layer for controlling second compression processing. A first compression unit performs the first compression processing corresponding to the first control signal on the feature plane data. A second compression unit performs the second compression processing corresponding to the second control signal on the feature plane data after the first compression processing. A type of processing of the second compression processing is different from the first compression processing.

20 Claims, 10 Drawing Sheets

(56) References Cited

U.S. PATENT DOCUMENTS

| | | |
|---|---|---|
| 10,210,419 B2 | 2/2019 | Nomura et al. |
| 10,268,881 B2 | 4/2019 | Chen |
| 2019/0121338 A1* | 4/2019 | Celia .................. G06N 3/02 |

* cited by examiner

| | LAYER 1 | LAYER 2 | LAYER 3 | LAYER 4 |
|---|---|---|---|---|
| BIT WIDTH | 8 | 8 | 8 | 8 |
| PIXEL COUNT/FEATURE PLANE | 1024 | 1024 | 1024 | 1024 |
| NUMBER OF FEATURE PLANES | 3 | 8 | 16 | 4 |
| MEMORY USE AMOUNT (KB) | 3 | 8 | 16 | 4 |

FIG. 7

|  | LAYER 1 | LAYER 2 | LAYER 3 | LAYER 4 |
|---|---|---|---|---|
| BIT WIDTH | 8 | $\frac{2}{1024}$ | $\frac{2}{512+256}$ | 8 |
| PIXEL COUNT/FEATURE PLANE | 1024 | 1024 | 512+256 | 1024 |
| NUMBER OF FEATURE PLANES | 3 | 8 | 16 | 4 |
| MEMORY USE AMOUNT (KB) | 3 | 2 | 3 | 4 |

|  | LAYER 1 | LAYER 2 | LAYER 3 | LAYER 4 |
|---|---|---|---|---|
| BIT WIDTH | 8 | 8 | 4 | 8 |
| PIXEL COUNT/FEATURE PLANE | 1024 | 256 | 256 | 256 |
| NUMBER OF FEATURE PLANES | 3 | 8 | 16 | 4 |
| MEMORY USE AMOUNT (KB) | 3 | 2 | 2 | 1 |

DATA PROCESSING APPARATUS, DATA PROCESSING METHOD, MEDIUM, AND TRAINED MODEL

BACKGROUND OF THE INVENTION

Field of the Invention

The present invention relates to a data processing apparatus, a data processing method, a medium, and a trained model.

Description of the Related Art

There is a demand for a hardware implementation technique for implementing processing using a neural network such as a convolutional neural network (to be referred to as a CNN hereinafter) at a low cost. The neural network can be used to, for example, extract a feature amount from data or perform recognition processing on data. Especially, the CNN is often used in deep learning for performing image recognition and the like. Particularly when the neural network is used in an embedded system or the like, it is desired to satisfy, with a small circuit scale, quality (for example, the recognition accuracy) of an output result obtained by processing using the neural network.

For example, by compressing feature planes of a layer included in the neural network, it is possible to reduce the circuit scale of a memory that temporarily stores feature planes during processing using the neural network. As a feature plane compression method, Chen (Y. Chen et al., "Eyeriss: An Energy-Efficient Reconfigurable Accelerator for Deep Convolutional Neural Networks", in IEEE Journal of Solid-State Circuits, vol. 52, no. 1, pp. 127-138, January 2017, doi: 10.1109/JSSC.2016.2616357) proposes to compress feature planes using run-length coding. In addition, Japanese Patent Laid-Open No. 2018-10618 proposes to quantize feature planes while changing a quantization bit width for each layer.

SUMMARY OF THE INVENTION

According to an embodiment of the present invention, a data processing apparatus comprises: an acquisition unit configured to acquire feature plane data of a layer included in a neural network; a control unit configured to output a first control signal corresponding to the layer for controlling first compression processing and a second control signal corresponding to the layer for controlling second compression processing; a first compression unit configured to perform the first compression processing corresponding to the first control signal on the feature plane data; and a second compression unit configured to perform the second compression processing corresponding to the second control signal on the feature plane data after the first compression processing, wherein a type of processing of the second compression processing is different from the first compression processing.

According to another embodiment of the present invention, a trained model comprises: a neural network; and for each layer included in the neural network, a first control signal which defines first compression processing on feature plane data of the layer, which is performed during calculation processing using the neural network, and a second control signal which defines second compression processing on the feature plane data of the layer, which is performed during calculation processing using the neural network, wherein a type of processing of the second compression processing is different from the first compression processing.

According to still another embodiment of the present invention, a data processing method comprises: acquiring feature plane data of a layer included in a neural network; outputting a first control signal corresponding to the layer for controlling first compression processing and a second control signal corresponding to the layer for controlling second compression processing; performing the first compression processing corresponding to the first control signal on the feature plane data; and performing the second compression processing corresponding to the second control signal on the feature plane data after the first compression processing, wherein a type of processing of the second compression processing is different from the first compression processing.

According to yet another embodiment of the present invention, a non-transitory computer-readable medium stores a program which, when executed by a computer comprising a processor and a memory, causes the computer to: acquire feature plane data of a layer included in a neural network; output a first control signal corresponding to the layer for controlling first compression processing and a second control signal corresponding to the layer for controlling second compression processing; perform the first compression processing corresponding to the first control signal on the feature plane data; and perform the second compression processing corresponding to the second control signal on the feature plane data after the first compression processing, wherein a type of processing of the second compression processing is different from the first compression processing.

Further features of the present invention will become apparent from the following description of exemplary embodiments (with reference to the attached drawings).

BRIEF DESCRIPTION OF THE DRAWINGS

FIG. 7 is a view showing examples of network parameters after applying compression of feature planes;

DESCRIPTION OF THE EMBODIMENTS

Figure 1:
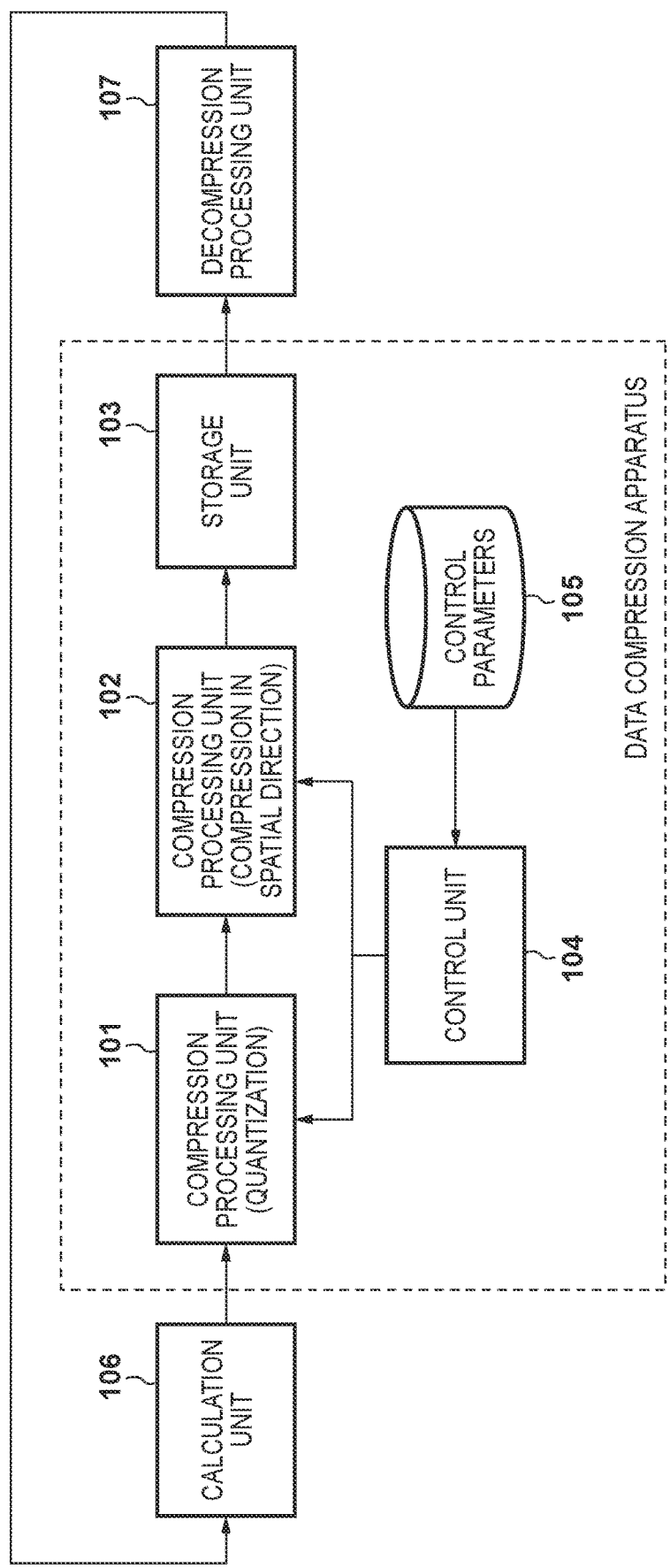
FIG. 1 is a block diagram showing an example of the arrangement of a data processing unit 305.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

To reduce the circuit scale of a memory for storing feature planes, it is desired to use a compression method of a higher compression ratio. However, the method using lossless run-length coding, which is described in Chen, is restricted in terms of a compression ratio. In the method using quantization, which is described in Japanese Patent Laid-Open No. 2018-10618, as the number of quantization bits is simply decreased, the quality of an output result from the neural network readily deteriorates.

One embodiment of the present invention can reduce the size of feature plane data stored in a memory while suppressing deterioration of the quality of an output result from a neural network.

According to one embodiment of the present invention, feature planes of a layer obtained by processing using a neural network are compressed by a plurality of compression units that perform different types of compression processes, respectively. With this arrangement, as compared with a case in which a single compression unit performs single compression processing, it is easy to reduce the use amount of a memory that stores feature planes while suppressing deterioration of the quality of the output result of the neural network. In other words, with this arrangement, it is possible to suppress deterioration of the quality of the output result of the neural network without increasing the use amount of the memory that stores feature planes. For example, according to one embodiment, when performing recognition processing using the neural network, it is possible to reduce a necessary memory size while suppressing degradation of recognition accuracy. Practical examples of the embodiment will be described below.

Note that according to one embodiment of the present invention, it is possible to perform fixed-length compression of feature planes. With this arrangement, when the memory that stores feature planes has a predetermined memory size, it is easy to compress feature planes to be stored in the memory. That is, use of fixed-length compression fixes the upper limit of the data size of the compressed feature planes stored in the memory. If variable length compression such as run-length coding described in Chen is used, it is impossible to fix the upper limit of the data size of the compressed feature planes, and thus a memory having a sufficient memory size is used to store the feature planes. On the other hand, if fixed-length compression is used, a memory having a memory size according to the upper limit of the data size of the compressed feature planes for each layer can be used to store feature planes. Therefore, if fixed-length compression is used, it is easy to reduce the memory size, as compared with a case in which variable length compression is used.

First Embodiment

Arrangement Example of Data Processing Apparatus

A data compression apparatus according to the first embodiment has an arrangement of compressing feature plane data (to be sometimes simply referred to as feature planes hereinafter in this specification) of a layer included in a neural network, which is obtained by processing using the neural network. More specifically, the data compression apparatus according to this embodiment can compress feature planes of the first layer of the neural network, and store them in a memory. Then, the data compression apparatus can perform calculation processing for generating feature planes of the second layer of the neural network using the compressed feature planes stored in the memory. Note that the data compression apparatus according to this embodiment may compress and store a part of a feature plane of one layer, instead of compressing and storing entire feature plane of one layer.

Figure 3:
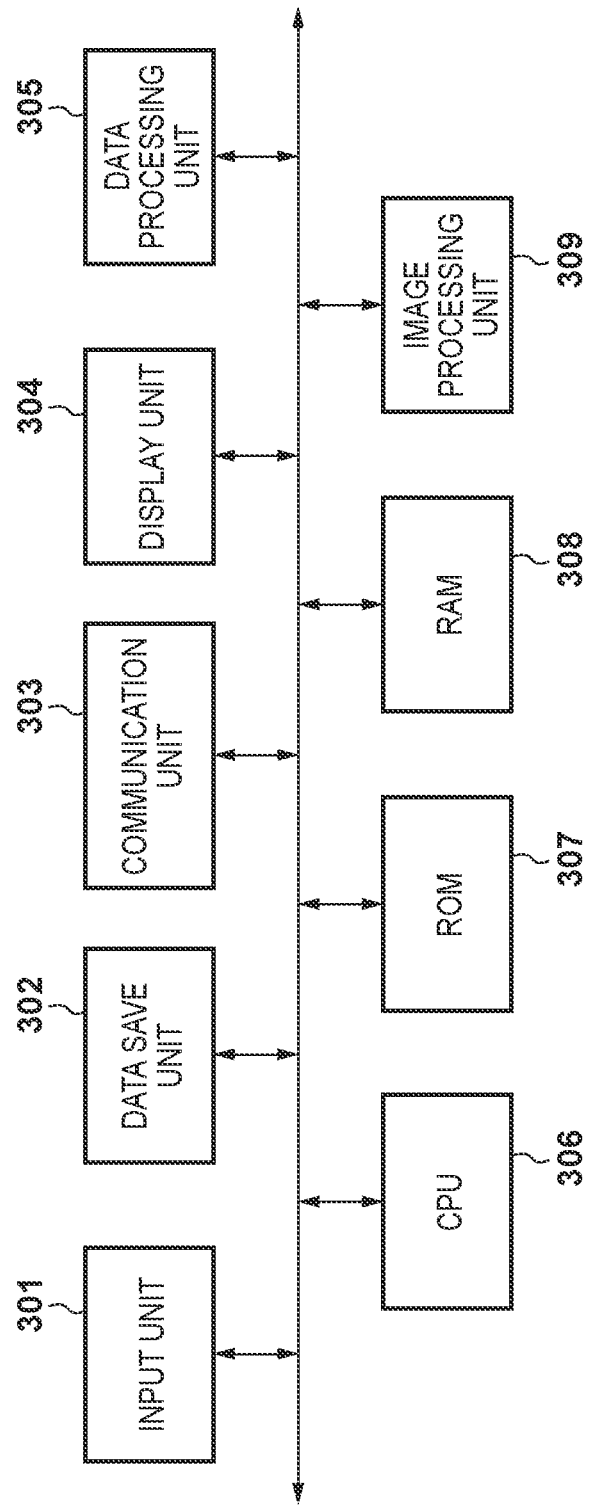
FIG. 3 is a block diagram showing an example of the arrangement of a data processing apparatus.

The data compression apparatus according to the first embodiment may be included in, for example, a data processing apparatus that performs calculation processing using a neural network. FIG. 3 is a block diagram showing an example of the arrangement of the data processing apparatus. The data processing apparatus can generate output data corresponding to input data by performing calculation processing using a neural network for the input data. For example, the data processing apparatus may generate, as output data, a result of recognition processing on the input data, and generate an output indicating the result of the recognition processing based on the output data. Furthermore, for example, the data processing apparatus may generate, as output data, a feature amount extracted from the input data, and perform further data processing (for example, image processing) for the input data based on the output data.

A data save unit 302 can store various data and parameters. The data save unit 302 may be, for example, a nonvolatile memory or a storage medium. Practical examples of the data save unit 302 are a hard disk, flexible disk, CD-ROM, CD-R, DVD, memory card, CF card, SmartMedia, SD card, memory stick, xD picture card, and USB memory. The data save unit 302 can store, for example, image data, and also save a program and other data. On the other hand, part of a RAM 308 (to be described later) may be used as the data save unit 302. Furthermore, the data save unit 302 may have a virtual arrangement. For example, a storage device of an apparatus connected via a communication unit 303 (to be described later) may be used as the data save unit 302.

A display unit 304 can display information such as an image. For example, the display unit 304 may display an image before or after image processing or an image of a GUI. The display unit 304 may be, for example, a display device such as a CRT or a liquid crystal display. On the other hand, the display unit 304 may be a display device outside the data processing apparatus, which is connected via a connection unit such as a cable.

An input unit 301 can acquire data or information of an instruction or the like. The input unit 301 may include, for example, an input device such as a keyboard, a pointing device, or a button. In this case, the user can input an instruction to the data processing apparatus via the input unit 301. On the other hand, the display unit 304 and the input unit 301 may be formed from a single device. For example, a touch screen can be used as the display unit 304 and the input unit 301.

A CPU 306 is a processor that controls the operation of the overall data processing apparatus. A ROM 307 and the RAM 308 are memories. The ROM 307 and the RAM 308 can provide, to the CPU 306, programs, data, and a working area necessary for processing of the CPU 306. For example, the CPU 306 can operate in accordance with a program loaded into the RAM 308. If a program is stored in the data save unit 302 or the ROM 307, the RAM 308 can load this program. If the data processing apparatus receives a program via the communication unit 303, the data save unit 302 temporarily stores the program, and then the RAM 308 may load the program. On the other hand, the RAM 308 may directly load the program from the communication unit 303. Note that the data processing apparatus may include two or more processors.

A data processing unit 305 can perform data processing on input data. In this embodiment, the data processing unit 305 performs, for the input data, processing using a neural network. For example, the data processing unit 305 can input the input data to the neural network, and perform calculation using the neural network, thereby generating an output from the neural network. As will be described later, the data processing unit 305 includes a data compression apparatus that compresses feature planes of a layer included in the neural network.

The CPU 306 can generate an output using the result of processing using the neural network generated by the data processing unit 305. For example, the CPU 306 may output the result of the recognition processing or the data processing result, as described above.

In one embodiment, the data processing apparatus can perform processing using a neural network for image data. In this embodiment, an image processing unit 309 can perform image processing on image data. For example, in accordance with a command from the CPU 306, the image processing unit 309 can read out image data stored in the data save unit 302, perform range adjustment processing of pixel values, and write the processed image data in the RAM 308. The data processing unit 305 can perform data processing on the image data having undergone image processing and saved in the RAM 308, and store a processing result in the RAM 308. Then, the CPU 306 can perform image processing or image recognition processing on the image data, and save a processing result in the RAM 308. The image data may be a moving image formed by a plurality of frames.

The communication unit 303 serves as an interface for performing communication between apparatuses. Note that the arrangement of the data processing apparatus is not limited to that shown in FIG. 3. For example, the data processing apparatus may include other components or may not include some components. Furthermore, the respective components may be interconnected by a communication path according to a known communication method. For example, the input unit 301, the data save unit 302, and the display unit 304 may be included in different apparatuses, and the data processing apparatus may have an arrangement in which these apparatuses are interconnected.

Arrangement Example of Neural Network

As described above, the data processing unit 305 performs, for input data, processing using a neural network. The processing using the neural network is not particularly limited, and a known neural network may be used. A neural network according to one embodiment includes a plurality of layers such as an input layer, a plurality of intermediate layers, and an output layer. In the processing using such neural network, by performing calculation processing using feature planes of a preceding layer, feature planes of a succeeding layer are obtained. In a practical example, by performing calculation processing using feature planes of the first layer, feature planes of the second layer succeeding to the first layer are obtained. After that, by performing calculation processing using the feature planes of the second layer, feature planes of the third layer succeeding to the second layer are obtained.

Note that the calculation processing of generating feature planes of a succeeding layer from feature planes of a preceding layer may include a product-sum operation, and may also include activation processing. For example, feature planes may be obtained as a result of a convolution operation and activation processing for each layer in a convolutional neural network (CNN). Processing of obtaining, from a plurality of feature planes $x_0^1, x_1^1, x_2^1, \ldots$ of a given layer l, an ith feature plane $x_i^{l+1}$ of a next layer l+1 can be performed in accordance with:

$$X_i^{l+1} = \phi\left(\sum_j (W_{i,j}^l * X_j^l) + b_i^l\right) \quad (1)$$

where $W_{i,j}^l$ represents a filter coefficient used for a convolution operation, $b_i^l$ represents a bias term, * represents a convolution operation, and $\phi$ represents an activation function.

Figures 4A, 4B:
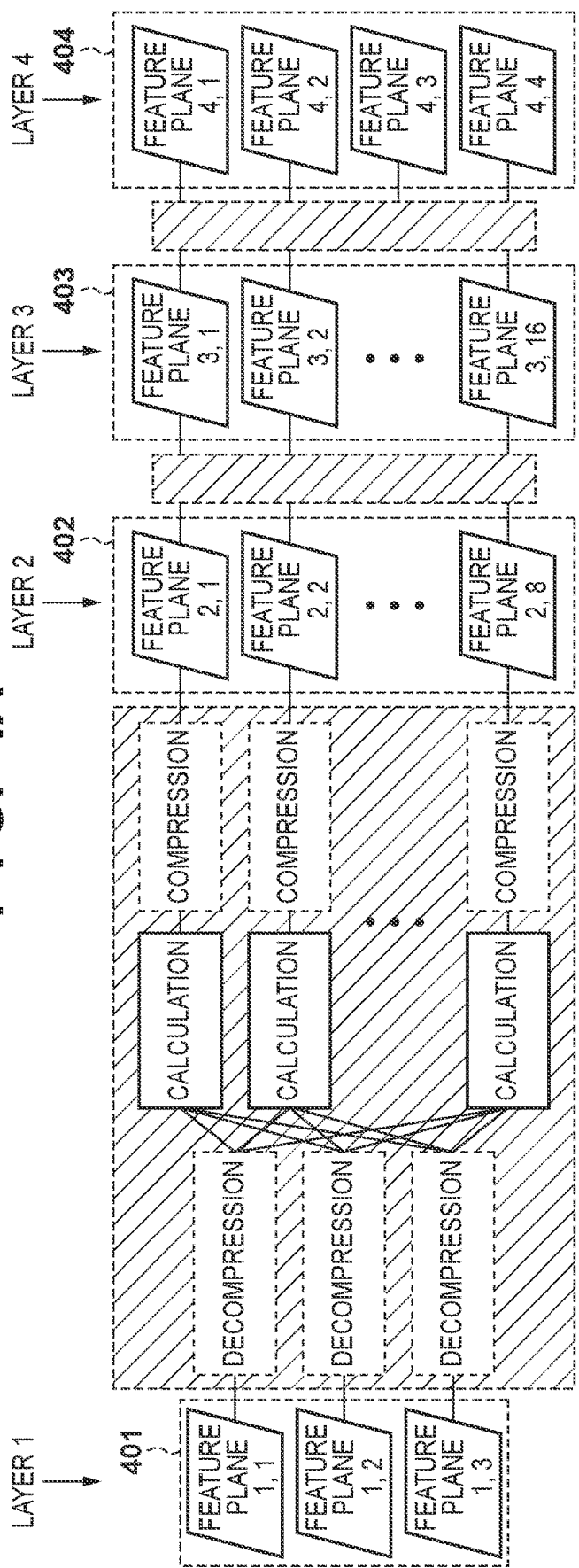
FIGS. 4A and 4B are views showing the structure of a neural network as an example of a processing target.

FIG. 4A shows a practical structure example of a neural network (to be referred to as a "network" hereinafter) as an example of a processing target according to this embodiment. The network structure can be determined based on the calculation amount of a product-sum operation, the size of each feature plane, the number of feature planes, a bit width, and the like. In the network exemplified in FIG. 4A, a pixel count per feature plane is 1,024, and the bit width (the data amount of the pixel value of each pixel) of each feature plane is 8. Layers 1 to 4 include different numbers of feature planes, and include three, eight, 16, and four feature planes, respectively. Layers may further exist upstream of layer 1 and downstream of layer 4.

A plurality of feature planes 402 of layer 2 can be obtained by executing calculation processing (a product-sum operation and activation processing corresponding to equation (1)) using a plurality of feature planes 401 and the filter coefficients of layer 1. Similarly, a plurality of feature planes 403 of layer 3 can be obtained by executing calculation processing using the plurality of feature planes 402 and the filter coefficients of layer 2. Furthermore, a plurality of feature planes 404 of layer 4 can be obtained by executing calculation processing using the plurality of feature planes 403 and the filter coefficients of layer 3.

The feature planes (for example, the feature planes 401 to 404) obtained by the above-described calculation processing are temporarily stored as intermediate data in the storage unit, and read out from the storage unit for calculation processing for obtaining feature planes of the next layer. In this embodiment, to reduce a memory capacity necessary to store feature planes, compression processing is performed for the feature planes and the feature planes having undergone the compression processing are stored in the storage unit. An arrangement example of the data processing unit 305 serving as the data compression apparatus according to one embodiment that performs calculation processing and compression processing will be described below with reference to FIG. 1.

Arrangement Example of Data Compression Apparatus

The data processing unit 305 includes compression processing units 101 and 102 each for performing compression processing on feature planes. The data processing unit 305 further includes a control unit 104 that controls the compression processes by the compression processing units 101 and 102. A portion formed by the compression processing units 101 and 102 and the control unit 104 can be referred to as a data compression apparatus. In an example shown in FIG. 1, the data compression apparatus further includes a storage unit 103 that stores compressed feature planes. The storage unit 103 can store feature plane data output from the compression processing unit 102. On the other hand, the storage unit 103 may be provided outside the data processing unit 305.

The compression processing units 101 and 102 perform different types of compression processes, respectively. The compression processes performed by the compression processing units 101 and 102 are controlled by the control unit 104. That is, the compression processing unit 101 performs the first compression processing corresponding to the first control signal for feature plane data of a layer included in the neural network. The compression processing unit 102 performs, for the feature plane data having undergone the first compression processing, the second compression processing of a type different from the first compression processing, which corresponds to the second control signal. In one embodiment, at least one or both of the first and second compression processes are lossy compression processes so as to obtain a higher compression ratio.

In one embodiment, the compression processing unit 101 performs quantization processing on values forming each feature plane. For example, the compression processing unit 101 can perform quantization processing on the value of each pixel. At this time, the compression processing unit 101 may perform fixed-length compression for the feature plane data. For example, the compression processing unit 101 can perform quantization processing according to a bit width designated by a control signal provided from the control unit 104, thereby performing fixed-length compression.

In one embodiment, the compression processing unit 102 can perform compression processing based on the relationship among a plurality of values forming each feature plane. For example, the compression processing unit 102 can perform processing of removing some of the plurality of values or run-length coding for the plurality of values. At this time, the compression processing unit 102 may also perform fixed-length compression for the feature plane data. For example, the compression processing unit 102 can perform compression processing according to a compression ratio designated by a control signal provided from the control unit 104, thereby performing fixed-length compression. In the following explanation, a ratio of a data size after compression to a data size before compression will be referred to as a compression ratio hereinafter.

The control unit 104 provides a control signal to each of the compression processing units 101 and 102. More specifically, the control unit 104 outputs the first control signal corresponding to a layer for controlling the first compression processing, and the second control signal corresponding to a layer for controlling the second compression processing. The control unit 104 outputs control signals corresponding to each of the layers (layers 1 to 4). For example, if the feature planes undergo fixed-length compression by the compression processing units 101 and 102, the control unit 104 can output the first and second control signals to control the data size after fixed-length compression for each layer.

In this embodiment, the control unit 104 switches the control signals for each layer with reference to predetermined control parameters 105. The control parameters 105 are determined in advance for each of layers 1 to 4 based on network information shown in FIG. 4B. The control parameters 105 may externally be provided to the data compression apparatus. Alternatively, the control parameters 105 may be stored in the data save unit 302 or the RAM 308.

The storage unit 103 is a storage device for storing the compressed feature planes, and can be referred to as a feature plane memory. The stored feature planes can be used to calculate feature planes of the next layer.

The data processing unit 305 can further include a calculation unit 106 and a decompression processing unit 107. The calculation unit 106 can perform calculation processing for calculating feature planes. That is, the calculation unit 106 can perform calculation processing of generating feature plane data of the next layer using feature plane data of the preceding layer stored in the storage unit 103. In this embodiment, the calculation unit 106 performs calculation processing based on equation (1) above. Furthermore, in this embodiment, the calculation unit 106 receives, as an input, the feature planes of the preceding layer whose bit width is 8 or less, and outputs feature planes of the next layer whose bit width is 8.

Furthermore, the decompression processing unit 107 can decompress the compressed feature planes stored in the storage unit 103, as needed. That is, the decompression processing unit 107 can decompress the compressed feature plane data stored in the storage unit 103, and supply it to the calculation unit 106.

As described above, if the compressed feature planes are stored in the storage unit 103, the decompression processing unit 107 can decompress the feature planes of the preceding layer stored in the storage unit 103, and transfer them to the calculation unit 106. In this case, the calculation unit 106 can perform calculation processing for calculating feature planes of the next layer using the received decompressed feature planes. In this embodiment, if the compressed feature planes are stored in the storage unit 103, the decompression processing unit 107 reads out the compressed feature planes, and performs decompression processing immediately after that. When compressing the feature planes of the next layer, the compression processing units 101 and 102 perform compression processes for the feature planes of the next layer received from the calculation unit 106 before storing the feature planes of the next layer in the storage unit 103, and stores the compressed feature planes in the storage unit 103. The compression processing units 101 and 102 may not compress the feature planes of the next layer under the control of the control unit 104.

Procedure of Data Compression Processing

Figure 2:
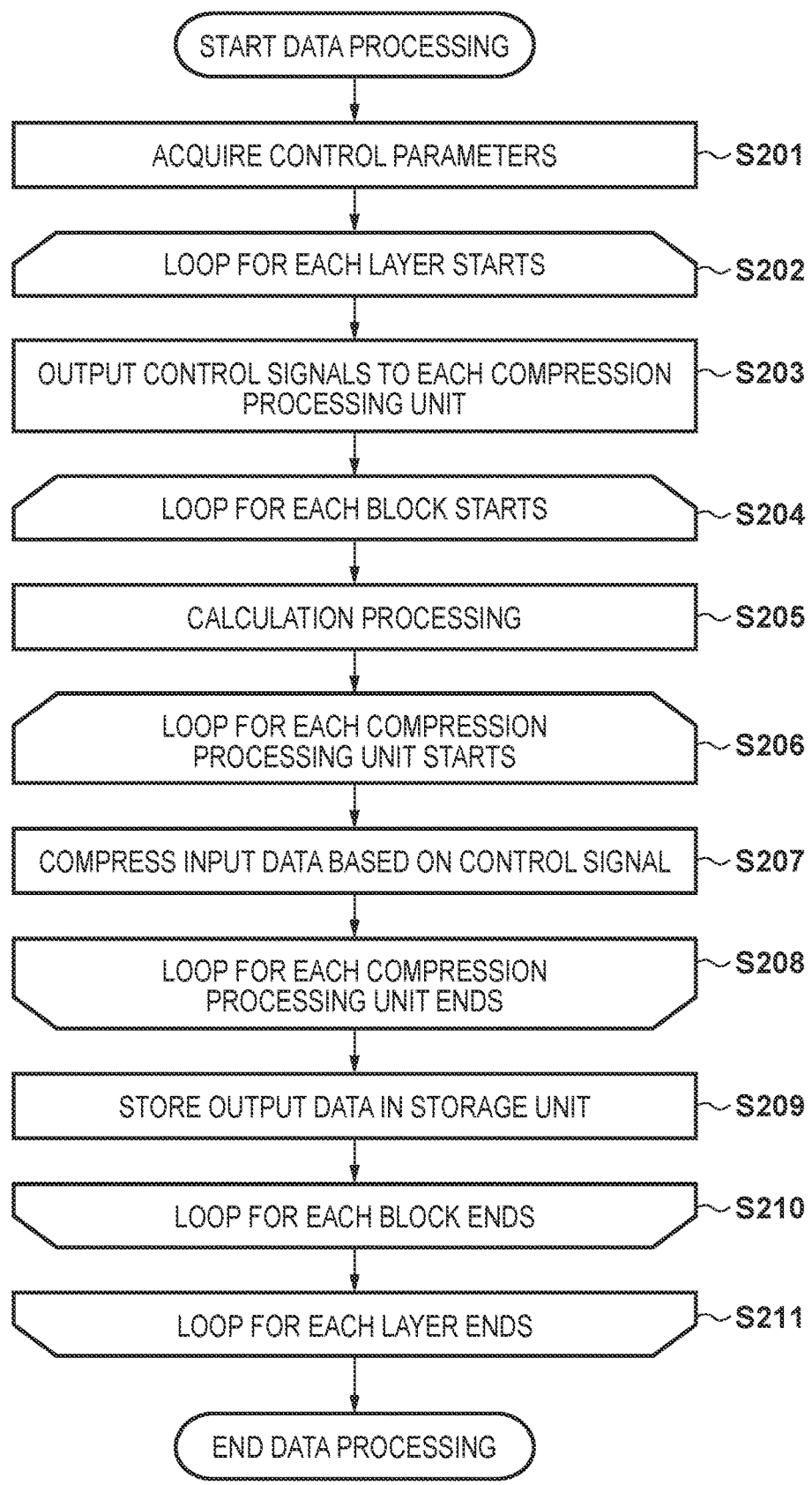
FIG. 2 is a flowchart illustrating an example of the processing of the data processing unit 305.

Processing performed by the data processing unit 305 will be described with reference to a flowchart shown in FIG. 2. A case in which the data processing unit 305 performs processing according to the network shown in FIG. 4A will be explained below. Steps S201 to S211 can implement data processing corresponding to the entire network shown in FIG. 4A. Furthermore, data processing corresponding to each of the layers (layers 1 to 4) is implemented by steps S203 to S210. That is, processes corresponding to the respective layers can sequentially be implemented by repeating processes in steps S203 to S210.

In one embodiment, data processing in each layer can be performed for each processing unit. This processing unit can be obtained by dividing feature plane data. In this embodiment, feature planes of the next layer are calculated for each processing unit (to be referred to as a feature plane block hereinafter) with a predetermined pixel count or data size. That is, each feature plane of the next layer is divided into a plurality of feature plane blocks, and a value for each feature plane block is obtained. In this embodiment, data processing of calculating each feature plane block is implemented by processes in steps S205 to S209. That is, processes corresponding to the respective feature plane blocks are sequentially implemented by repeating the processes in steps S205 to S209, thereby obtaining the feature planes of the next layer. In this arrangement, the compression processing units 101 and 102 can respectively perform the first and second compression processes for each of the plurality of processing units (for example, each of the feature plane blocks) obtained by dividing the feature plane data.

It is not essential to perform data processing for each feature plane block. However, in such method, the data size of the processing unit can be decreased. That is, the processing units of the calculation unit 106, the compression processing units 101 and 102, and the decompression processing unit 107 can be decreased. With this arrangement, the circuit scale of the data processing unit 305 can be reduced, as compared with a case in which processing is performed for each feature plane (for example, a case in which the feature planes of one layer are collectively compressed and decompressed). Furthermore, by performing data processing for each feature plane block, it becomes easy to perform processing using information of a spatial direction. For example, when a plurality of pixels are collectively processed, compression processing can be performed in consideration of the property (for example, the property that a value is locally large or small) of data in a feature plane block, and it is thus easy to improve the compression ratio while suppressing a compression error.

In step S201, the control unit 104 acquires the control parameters 105. A method of determining the control parameters 105 will be described later.

In step S202, a loop (steps S202 to S211) for each layer starts. A loop count is given by the number of layers of the network−1 (=the number of layers except for the input layer). In the network shown in FIG. 4A, the number of layers except for layer 1 as the input layer is three, and thus the loop is performed three times. Feature planes generated by performing processes in steps S202 to S211 once will be referred to as the feature planes of the next layer hereinafter, and feature planes which are referred to in the processes will be referred to as the feature planes of the preceding layer hereinafter.

In step S203, the control unit 104 generates control signals based on the control parameters 105 acquired in step S201. The control parameters 105 are set for each layer, and the control signals are changed for each layer. That is, the control unit 104 generates control signals based on the control parameters 105 corresponding to the next layer.

In step S204, a loop (steps S204 to S210) for each feature plane block starts. A loop count matches the number of feature plane blocks on each feature plane generated by the calculation processing. In this embodiment, the sizes of the feature plane blocks in each layer are the same. On the other hand, the number of feature plane blocks is different for each layer. Therefore, the loop count varies for each layer. A case in which each feature plane block is formed by eight pixels and a bit width is 8 will be described below.

In step S205, the calculation unit 106 reads out the feature planes of the preceding layer from the storage unit 103 or acquires them from the decompression processing unit 107. Practical processing performed by the decompression processing unit 107 will be described later. The calculation unit 106 performs the calculation processing according to equation (1) with reference to the feature planes (a bit width of 2 or 8) of the preceding layer, and outputs an obtained result as a feature plane block (a bit width of 8) of the next layer.

In step S206, a loop (steps S207 to S209) for each compression processing unit starts. A loop count matches the number of feature plane blocks on each feature plane generated by the calculation processing. In this embodiment, since the number of compression processing units is two (the compression processing units 101 and 102), the loop count is two. If the number of compression processing units is three or more, compression processes by the respective compression processing units are performed by repeating steps S207 to S209.

In step S207, the compression processing unit 101 or 102 compresses the feature plane block by the compression processing. In step S208, the loop for each compression processing unit ends. If there exists the next compression processing unit, the compressed feature plane block is output to the next compression processing unit, and the process returns to step S206.

In step S207 of the first loop, the compression processing unit 101 performs the first compression processing corresponding to the first control signal for the feature plane block. Information necessary for compression is provided in the form of the control signal from the control unit 104.

Figure 5:
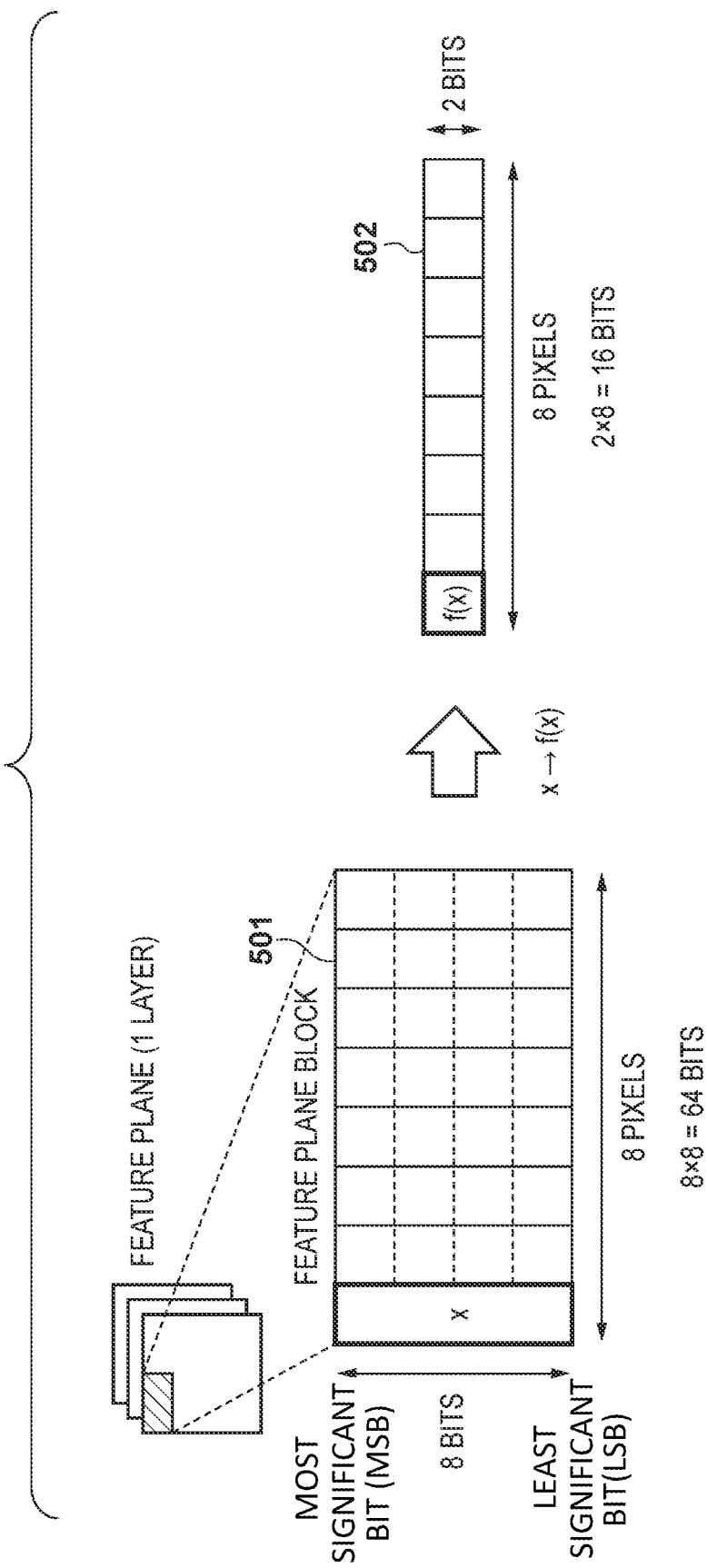
FIG. 5 is a view for explaining a processing algorithm used by a compression processing unit 101.

In this embodiment, the compression processing unit 101 performs fixed-length compression by executing quantization processing as the first compression processing. At this time, the compression processing unit 101 performs quantization with a bit width designated by the control signal. Note that the compression processing unit 101 may perform quantization in accordance with the reduction amount of the bit width designated by the control signal. FIG. 5 is a view for explaining the quantization processing by the compression processing unit 101. In an example shown in FIG. 5, a feature plane block 501 of 8 bits and eight pixels is compressed, and quantization with a bit width of 2 is designated by the control signal. In this case, the compression processing unit 101 can convert a value x of each pixel of the feature plane block into an output value f(x) based on:

$$f(x) = \begin{cases} 0 & (x < T_0) \\ 1 & (T_0 \le x < T_1) \\ 2 & (T_1 \le x < T_2) \\ 3 & (T_2 \le x) \end{cases} \quad (2)$$

Parameters used for the quantization processing, such as thresholds $T_0$, $T_1$, and $T_2$ indicated by equation (2) may be determined in advance or provided by a control signal or the like. The compression processing unit 101 outputs a feature plane block 502 having the thus obtained output value f(x) to the compression processing unit 102 as a feature plane block after the first compression processing. On the other hand, the control unit 104 may generate the first control signal to control, for each layer, whether to perform the first compression processing. For example, if a bit width of 8 is designated by the control signal (that is, it is designated that no quantization processing is performed), the compression processing unit 101 can output the feature plane block 501 intact as the feature plane block 502 to the compression processing unit 102.

At this time, using a quantized bit width 1' and a pixel count w, a size L' of the feature plane block 502 shown in FIG. 5 can be given by:

$$L' = l' \times w \quad (3)$$

For example, in the example shown in FIG. 5, since (l', w)=(2, 8), the size L' of the feature plane block 502 is 16. On the other hand, a size L of the feature plane block 501 obtained in the same manner in accordance with equation (3) is 64. As described above, in the example shown in FIG. 5, the data size of the feature plane block is compressed to 25% by the first compression processing.

In step S207 of the second loop, the compression processing unit 102 performs the second compression processing corresponding to the second control signal for the feature plane block after the first compression processing. Information necessary for compression is provided in the form of the control signal from the control unit 104.

Figure 6:
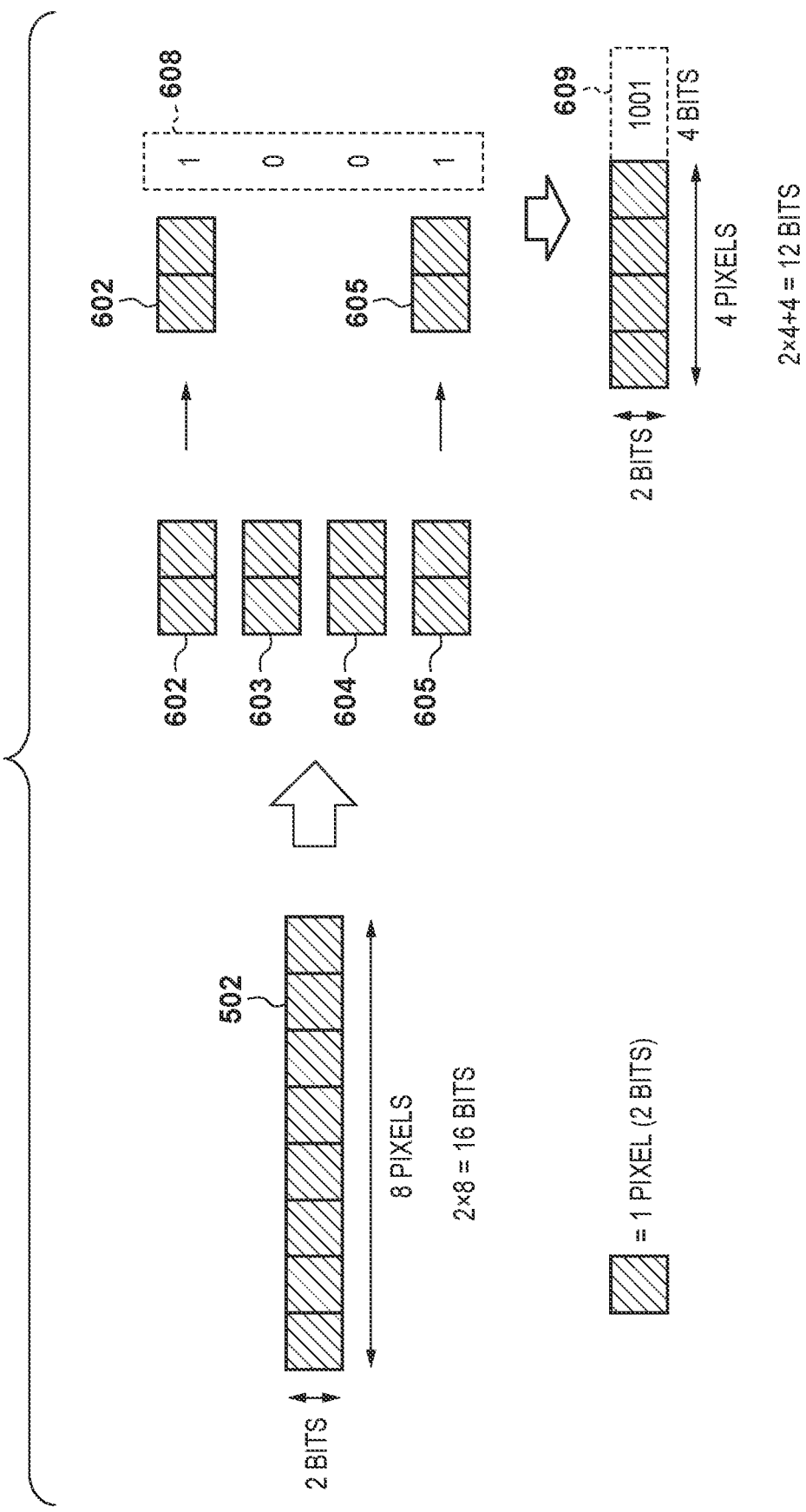
FIG. 6 is a view for explaining a processing algorithm used by a compression processing unit 102.

In this embodiment, the compression processing unit 102 performs fixed-length compression by executing, as the second compression processing, compression processing using the information of the spatial direction of the feature plane block. FIG. 6 is a view for explaining the compression processing by the compression processing unit 102. In an example shown in FIG. 6, the feature plane block 502 of 2 bits and eight pixels is compressed, and the following compression method is designated by the control signal.

First, the compression processing unit 102 generates divided data 602 to 605 by dividing the feature plane block 502 for every two pixels. The compression processing unit 102 selects two of the divided data 602 to 605. An example of a data selection method is a method of preferentially selecting divided data whose sum of values is larger. Furthermore, the compression processing unit 102 generates a bit string 608 indicating the selected divided data. For example, the bit string 608 indicates that the first divided data 602 and the fourth divided data 605 from the beginning of the feature plane block 502 are selected. The compression processing unit 102 then generates a feature plane block 609 after the second compression processing by concatenating the selected divided data 602 and 605 and the bit string 608.

As described above, in one embodiment, the compression processing unit 102 performs compression processing on a data array (the feature plane block 502) in the spatial direction. This compression processing includes processing of dividing the data array into the plurality of divided data 602 to 605, processing of removing the divided data 603 and 604 as some of the plurality of divided data, and processing of generating the bit string 608 as information indicating the positions of the removed divided data in the data array.

A size L" of the output feature plane block 609 is determined based on the pixel count w and bit width 1' of the feature plane block 502, the number n of divided data, and the number m of selected divided data. That is, since the pixel count of each of the divided data 602 and 605 is given by w/n and the bit length of the bit string 608 is n, the size L" of the feature plane block 609 can be given by:

$$L''=l'\times m\times(w/n)+n \qquad (4)$$

For example, in the example shown in FIG. 6, since (l', m, n, w)=(2, 2, 4, 8), the size L" of the feature plane block 609 is 12. On the other hand, the size L' of the feature plane block 502 is 16. In the example shown in FIG. 6, the data size of the feature plane block is compressed to 75% by the second compression processing.

In this embodiment, the control unit 104 can designate, by the second control signal, at least one of the compression processing parameters, that is, the number n of divided data and the number m of selected divided data. Therefore, the compression processing unit 102 can perform fixed-length compression in accordance with the control signal. On the other hand, the control unit 104 may generate the second control signal to control, for each layer, whether to perform the second compression processing. For example, if the control signal designates that no compression processing is performed (for example, if n=m=1 is designated as parameters), the feature plane block 502 is used intact as the feature plane block 609.

In step S209, the compression processing unit (for example, the compression processing unit 102) of the final stage stores the generated feature plane block 609 in the storage unit 103.

As described above, in step S205, if the compressed feature plane is stored in the storage unit 103, the decompression processing unit 107 decompresses the feature plane and outputs it to the calculation unit 106. For example, in response to a request of the calculation unit 106, the decompression processing unit 107 may decompress the compressed feature plane block corresponding to the feature plane block to be used by the calculation unit 106.

In this case, the decompression processing unit 107 can use decompression processing methods corresponding to the first and second compression processes used by the compression processing units 101 and 102. The decompression processing unit 107 can change decompression processing for each layer. That is, the decompression processing unit 107 can perform decompression processes corresponding to the first and second compression processes controlled for each layer.

For example, the decompression processing unit 107 can decompress the compressed feature plane stored in the storage unit 103 using the second decompression processing corresponding to the second compression processing. In the above-described example, the decompression processing unit 107 can rearrange the selected divided data 602 and 605 at the original positions with reference to the bit string 608 included in the feature plane block 609. The decompression processing unit 107 can complement the unselected divided data 603 and 604 by zero bits. In this way, the decompression processing unit 107 can generate a feature plane block corresponding to the feature plane block 502, in which partial information is missing. The control unit 104 may output, to the decompression processing unit 107, a control signal corresponding to the preceding layer for controlling the second decompression processing by the decompression processing unit 107.

The second compression processing performed by the compression processing unit 102 is not limited to the above example. However, the above-described second compression processing makes it possible to compress the feature plane while suppressing deterioration of the quality of the output result of the neural network to be relatively small. In general, in a feature plane generated by a convolutional neural network, a ratio of pixels each having a pixel value of 0 to all pixels is often high. If the above method is used, information about pixels each having a pixel value of 0 is preferentially missing. However, since the pixel values of these pixels are complemented by 0, the possibility that the pixel values of the feature plane vary due to compression and decompression is relatively low. It is, therefore, possible to suppress deterioration of the quality of the output result of the neural network, for example, degradation of accuracy in recognition processing using the neural network.

As described above, in one embodiment, the selected divided data and the removed divided data are dynamically selected for each feature plane block. On the other hand, a divided data selection method is not limited to the above example, and can appropriately be selected in accordance with the characteristic of processing to be implemented by the neural network and the property of data to be input to the neural network. For example, in a specific embodiment, divided data whose sum of values is smaller may preferentially be selected or the pixel values of missing pixels may be complemented by a value other than 0.

The decompression processing unit 107 can decompress the feature plane obtained by the second decompression processing using the first decompression processing corresponding to the first compression processing. In the above example, the decompression processing unit 107 may perform inverse quantization processing (processing of increasing values by 64 times) for the values of the feature plane block after the second decompression processing. On the other hand, it is not essential to perform the first decompression processing. For example, the calculation unit 106 may perform calculation processing in consideration of quantization (for example, after increasing the values of the feature plane by 64 times). As described above, it is not essential that the decompression processing unit 107 performs the decompression processes completely corresponding to the first and second compression processes.

In step S210, the loop for each feature plane block ends. If there exists the next feature plane block, the process returns to step S204 to perform the processing for the next feature plane block; otherwise, the process advances to step S211.

In step S211, the loop for each layer ends. If there exists the next layer (for example, if the feature planes of layers 2 and 3 are calculated), the process returns to step S202 to calculate the feature planes of the next layer; otherwise (for example, if the feature planes of the output layer (layer 4) are calculated), the series of data compression processes ends.

Control Parameters

Practical examples of the control parameters 105 and a creation method will be described below. The control parameters 105 can be created to reduce the memory use amount of the storage unit 103 (feature plane memory). In the following example, the control parameters 105 are preset based on the network information shown in FIG. 4B and the constraint of the data processing apparatus shown in FIG. 3. In the example shown in FIG. 4B, information representing the size of each feature plane is used as the network information. As shown in FIG. 4B, the network information may include, for example, the size (pixel count) of each feature plane of each layer, the number of feature planes of each layer, and the bit width of each feature plane of each layer. With reference to the thus set control parameters 105, the control unit 104 can output the first and second control signals as signals determined based on the size of each feature plane of each layer, the number of feature planes of each layer, and the bit width of each feature plane of each layer. Note that in the following example, the feature planes of the input layer (layer 1) and those of the output layer (layer 4) are also stored in the storage unit 103. However, this is not essential, and only the feature planes of the intermediate layers may be stored in the storage unit 103.

As will be described later, the control parameters 105 can be determined based on the capacity of the storage unit 103. With reference to the thus set control parameters 105, the control unit 104 can output the first and second control signals as signals determined based on the capacity of the storage unit 103. Then, by compressing the feature planes based on the control signals, the data processing apparatus can process the network shown in FIG. 4A using the storage unit 103 having the limited capacity.

In one embodiment, the upper limit of the memory use amount of the storage unit 103 corresponds to the maximum value of the total data size of the feature planes of successive two layers. For example, when calculating the feature planes 402 of layer 2 using the feature planes 401 of layer 1, the storage unit 103 holds both an area to store the feature planes 401 to be output to the calculation unit 106 and an area to store the feature planes 402 output from the calculation unit 106. The same applies to the remaining layers.

In the following example, the storage unit 103 has a memory capacity of 7 KB. Furthermore, the sizes of the feature planes 401 to 404 each indicate a bit width, a pixel count per feature plane, and the product of the number of feature planes, and are 3 KB, 8 KB, 16 KB, and 4 KB, respectively. When calculating the feature planes 404 using the feature planes 403, the total size of the feature planes 403 and 404 are 20 KB. Therefore, when processing the network shown in FIG. 4A using the storage unit 103, the compressed feature planes 403 and 404 are stored in the storage unit 103. The compression ratios by the compression processing units 101 and 102 are determined based on the memory capacity of the storage unit 103 and the network information of the network shown in FIG. 4B.

A method of determining the compression ratio of the first compression processing by the compression processing unit 101 will be described first. The bit width of each feature plane can be determined to obtain the allowable accuracy of postprocessing. The feature planes 404 of the output layer (layer 4) are output from the data processing unit 305, and used in the postprocessing such as recognition processing for obtaining a recognition result. In the following example, to obtain the allowable accuracy of the postprocessing, the bit width of each feature plane 404 is set to 8, and no reduction of the bit width is performed. In the following example, even if the bit width of each of the feature planes 402 and 403 is reduced to 2, the allowable accuracy of the postprocessing is obtained, and thus the bit width of each of the feature planes 402 and 403 is reduced to 2.

The sizes of the feature planes 401 to 404 after compression by the compression processing unit 101 are 3 KB, 2 KB, 4 KB, and 4 KB, respectively. Therefore, to calculate the feature planes 404 using the feature planes 403, at least the feature planes 403 or 404 are further compressed so that the feature planes 403 and 404 after compression are stored in the storage unit 103. On the other hand, if the bit width is further reduced, the accuracy of the postprocessing may become unallowable. Thus, in this embodiment, the compression processing unit 102 further compresses at least the feature planes 403 or 404.

Next, a method of determining the compression ratio of the second compression processing by the compression processing unit 102 will be described. In this example, the compression processing unit 102 reduces the data size to 3 KB by compressing the feature planes 403 to 0.75 times. The compression processing units 101 and 102 perform different types of compression processes using different redundancies, respectively. In this example, the compression processing unit 101 compresses the feature planes by reducing the bit width, and the compression processing unit 102 compresses the feature planes in the spatial direction. By using the compression processing units 101 and 102 that use different redundancies, in this way, it is expected to suppress deterioration of the quality of the output result of the neural network, as compared with a case in which the compression processing unit 101 further reduces the bit width.

FIG. 7 shows the network information and the memory use amount when compressing the feature planes, as described above. The compression processing unit 102 reduces, to 512, the pixel count per feature plane 403. On the other hand, the bit string 608 is added to the data of each compressed feature plane 403, and the data size of the bit string 608 corresponds to 256 pixels. Therefore, each compressed feature plane 403 has a data size of 768 pixels in total. In this case, when calculating the feature planes 404 using the feature plane 403, the storage unit 103 can store the feature planes 403 and 404 (7 KB in total) after compression. In addition, the upper limit of the memory use amount when processing the network shown in FIG. 4A is 7 KB obtained when calculating the feature planes 404 from the feature planes 403. As described above, with the combination of the compression processing units 101 and 102, it is possible to process the network shown in FIG. 4A using the storage unit 103 having the limited memory capacity.

The control parameters 105 can be determined based on the network information indicating the size of each compressed feature plane shown in FIG. 7. The control parameters 105 may be information necessary for compression of each feature plane, that is, information indicating the compression ratio and the compression method of each feature plane. That is, the control parameters 105 may include, for each layer, information indicating whether to perform the first compression processing by the compression processing unit 101. The control parameters 105 may include information indicating the compression ratio or the compression method by the compression processing unit 101 in each layer. In the example shown in FIG. 7, the control parameters 105 indicate a quantization bit width after compression for each layer, and the quantization bit widths of layers 1 to 4 are 8, 2, 2, and 8, respectively. The control parameters 105 may further indicate, for a layer of a bit width of 2 to undergo compression, the thresholds $T_0$, $T_1$, and $T_2$ indicated by equation (2).

Furthermore, the control parameters 105 may include, for each layer, information indicating whether to perform the second compression processing by the compression processing unit 102. The control parameters 105 may include information indicating the compression ratio or the compression method by the compression processing unit 102 in each layer. In the example shown in FIG. 7, the control parameters 105 include information indicating that layer 3 is a target of the second compression processing and the parameters n and m of equation (4). The values of n and m corresponding to layer 3 are given so that the data size L" of the feature plane block 609 becomes 75% of the data size L' of the feature plane block 502. The control parameters 105 include information indicating that the remaining layers are not targets of the second compression processing.

In step S203 described above, the control unit 104 can output the first and second control signals corresponding to each layer in accordance with the control parameters 105 corresponding to each layer. In this example, the control unit 104 outputs the first control signal indicating that the first compression processing of reducing the bit width to 2 is performed for layers 2 and 3 without executing the first compression processing for layers 1 and 4. The control unit 104 outputs the second control signal indicating that the second compression processing is performed for layer 3 using the parameters (n, m)=(4, 2) without executing the second compression processing for layers 1, 2, and 4.

Second Embodiment

The types of the first and second compression processes are not particularly limited. In the second embodiment, each feature plane is compressed by a combination of compression processes different from that in the first embodiment. A data processing apparatus according to the second embodiment has an arrangement similar to that shown in FIG. 3 in the first embodiment. On the other hand, a data processing unit 305 is different from that in the first embodiment, and has an arrangement shown in FIG. 8.

Figure 8:
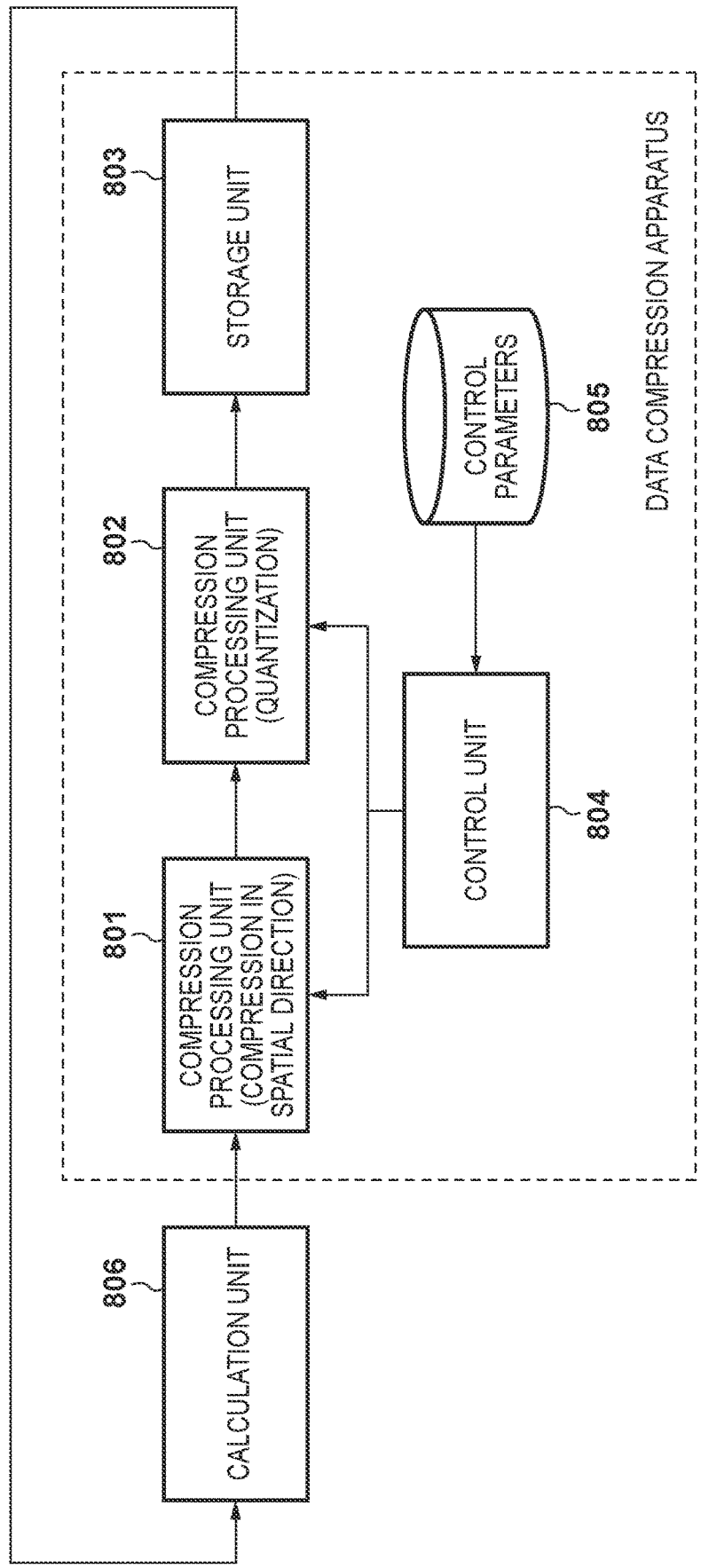
FIG. 8 is a block diagram showing an example of the arrangement of a data processing unit 305.

As shown in FIG. 8, the data processing unit 305 includes compression processing units 801 and 802, a storage unit 803, a control unit 804, and a calculation unit 806. The arrangements and operations of the compression processing units 801 and 802 are similar to those of the compression processing units 101 and 102 according to the first embodiment but the first compression processing performed by the compression processing unit 801 and the second compression processing performed by the compression processing unit 802 are different from those in the first embodiment. The arrangements and operations of the storage unit 803, the control unit 804, and the calculation unit 806 are similar to those of the storage unit 103, the control unit 104, and the calculation unit 106 according to the first embodiment. The control unit 804 operates in accordance with control parameters 805, similar to the first embodiment. On the other hand, unlike the first embodiment, the data processing unit 305 has no decompression processing unit.

The first compression processing performed by the compression processing unit 801 and the second compression processing performed by the compression processing unit 802 according to this embodiment will be described below. An example of compressing a feature plane block 901 of 8 bits and 16 pixels will be explained below with reference to FIGS. 9 and 10. In the following example, the feature plane block is output for each rectangular region with eight pixels in the X direction and two pixels in the Y direction, and has a bit width of 8.

Figure 9:
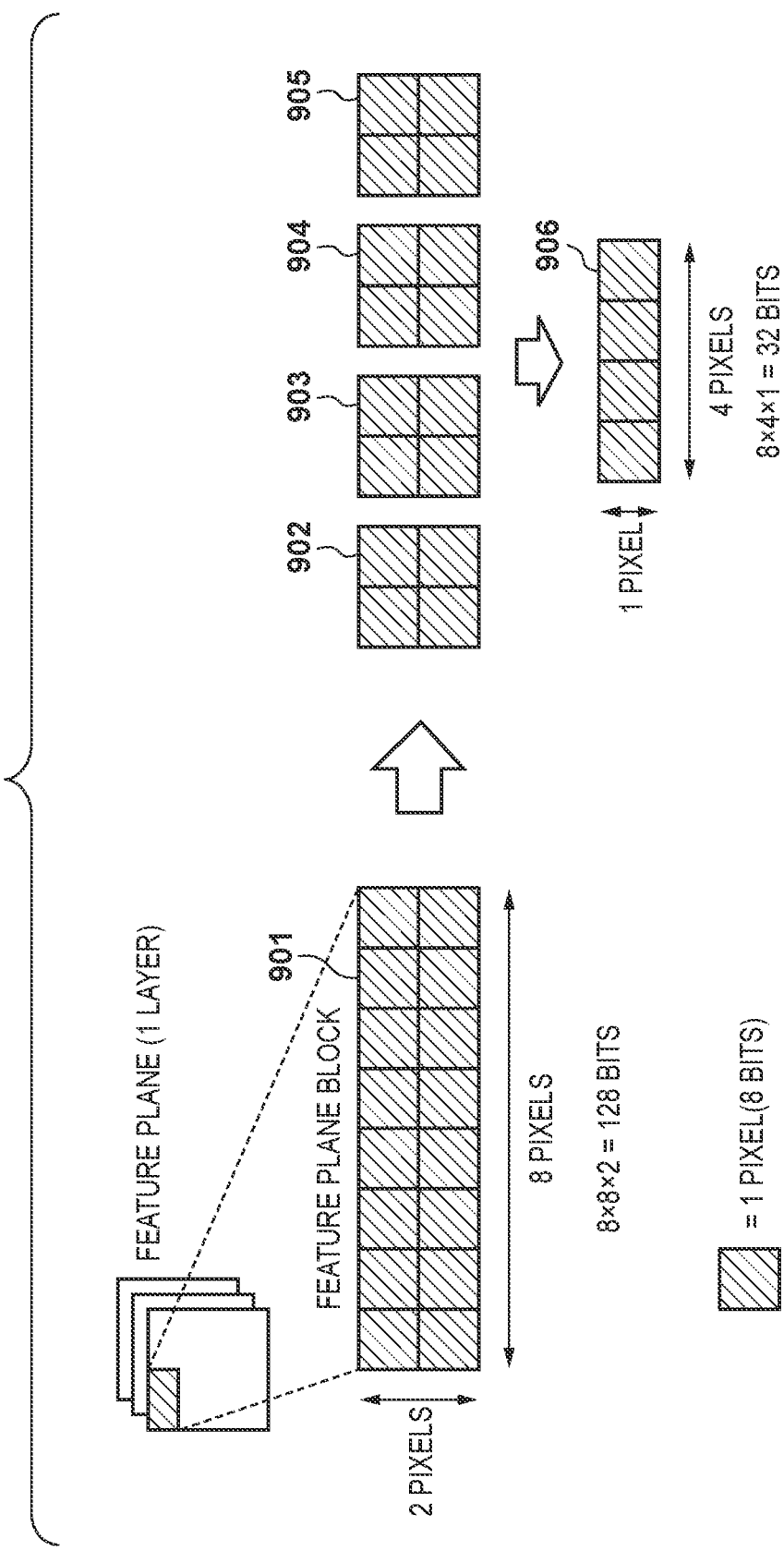
FIG. 9 is a view for explaining a processing algorithm used by a compression processing unit 801.

The compression processing unit 801 performs fixed-length compression for the feature plane block 901 by down-sampling the feature plane block 901 in the spatial direction. First, as shown in FIG. 9, the compression processing unit 801 divides the feature plane block 901 into a plurality of divided data 902 to 905 each of which is a rectangular region with two pixels in the X direction and two pixels in the Y direction. Next, the compression processing unit 801 determines a central value for each of the divided data 902 to 905, and generates a feature plane block 906 after the first compression processing by combining the determined central values. A central value determination method is not particularly limited. For example, a method of selecting the maximum or minimum value of the four pixels, a method of obtaining the average value of the four pixels, or the like is adopted. In this way, the compression processing unit 801 can reduce the pixel count per feature plane. Note that if the compression processing unit 801 reduces the pixel count per feature plane of a given layer, it is possible to reduce the pixel count of each of the feature planes of all the subsequent layers in the same manner.

In this case, a size L' of the feature plane block 906 shown in FIG. 9 is always ¼ of the size of the feature plane block 901. Since the pixel count of the feature plane block 906 is ¼ of the pixel count of the feature plane block 901, the size L' of the feature plane block 906 can be given by:

$$L' = l' \times (w/4) \tag{5}$$

where l' represents the bit width and w represents the pixel count of the feature plane block 901.

In the example shown in FIG. 9, since (l, w)=(8, 16), L' is 32. Since a size L of the feature plane block 901 is 128, it is understood that the data size of the feature plane block is compressed to 25%.

Figures 10, 11:
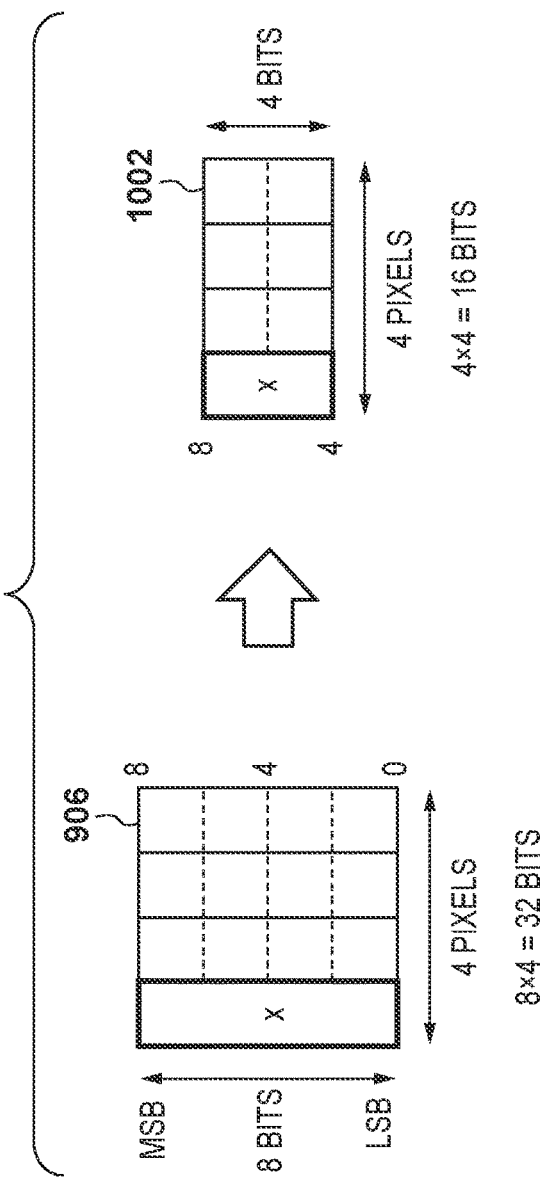
FIG. 10 is a view for explaining a processing algorithm used by a compression processing unit 802.
FIG. 11 is a view showing examples of network parameters after applying compression of feature planes.

The compression processing unit 802 performs fixed-length compression for the feature plane block 906 by performing quantization with a bit width designated by a control signal. As shown in FIG. 10, the compression processing unit 802 performs rounding processing on the feature plane block 906 of 8 bits and four pixels obtained by the first compression processing. That is, if a bit width of 4 is designated, the compression processing unit 802 can obtain a feature plane block 1002 after the second compression processing by rounding up or down lower 4 bits of each pixel value of the feature plane block 906.

At this time, a size L" of the feature plane block 1002 is determined based on the quantization bit width l'. That is, the size L" of the feature plane block 1002 can be given by:

$$L''=l'\times w' \qquad (6)$$

where w' represents the pixel count of the feature plane block 1002.

In the example shown in FIG. 10, since (l', w')=(4, 4), L" is 16. Since the size L' of the feature plane block 906 is 32, it is understood that the data size of the feature plane block is compressed to 50%.

The procedure of processing performed by the data processing unit 305 is similar to that in the first embodiment. The difference from the first embodiment will be described below with reference to the flowchart of FIG. 2. Step S201 is similar to that in the first embodiment except that the first and second control signals corresponding to the above-described first and second compression processes are output. The control signals and the control parameters 805 according to this embodiment will be described later.

In step S205, the calculation unit 806 reads out feature planes of a preceding layer from the storage unit 803, and performs calculation processing using the feature planes of the preceding layer, thereby generating feature planes of the next layer. In this embodiment, since the above-described first and second compression processes are performed, the calculation unit 806 can use, directly for calculation processing, the feature planes read out from the storage unit 803. For example, the feature planes after the quantization processing can be used intact to perform calculation processing. That is, the processing of decompressing the compressed feature planes by the decompression processing unit can be omitted.

In one embodiment, each of the first and second compression processes is processing of reducing the pixel count in the spatial direction, a channel count, or the bit width of a value. In this arrangement, the processing of decompressing the compressed feature planes by the decompression processing unit is omitted. On the other hand, in other cases, the calculation unit 806 may generate feature planes of the next layer by calculation processing using the compressed feature planes of the preceding layer intact. For example, in the first embodiment, the second decompression processing may be omitted.

By omitting the decompression processing in this way, it is possible to reduce the calculation amount of data processing using a neural network. For example, if the pixel count per feature plane is reduced by compression processing and calculation processing is performed using the compressed feature planes, the number of product-sum operations is decreased. By reducing the calculation amount in this way, it is possible to shorten the processing time or reduce the circuit scale of the data processing unit 305 without increasing the processing time. By performing the decompression processing on the compressed feature planes as in the first embodiment, the quality of the output result is expected to be improved. On the other hand, if the quality of the output result is allowable, it is possible to reduce both the memory use amount and the calculation amount by omitting the decompression processing as in the second embodiment.

In step S207, the compression processing units 801 and 802 compress each feature plane by the above-described first and second compression processes. The remaining steps are similar to those in the first embodiment.

Control Parameters

Practical examples of the control parameters 805 and a creation method thereof will be described below. In the following example as well, the control parameters 805 are set based on network information shown in FIG. 4B and the constraint of the data processing apparatus shown in FIG. 3. In the second embodiment as well, the upper limit of the memory use amount of the storage unit 803 corresponds to the maximum value of the total data size of the feature planes of successive two layers. In the following example, the storage unit 803 has a memory capacity of 5 KB.

First, a method of determining the compression ratio of the first compression processing by the compression processing unit 801 will be described. The compression processing unit 801 reduces the size of each feature plane, that is, a pixel count per feature plane to ¼, and reduces the data sizes of the feature planes of all the subsequent layers. On the other hand, if recognition processing on an image is performed, it is expected to improve the recognition accuracy by setting an object size in the image with respect to an image size input to the data processing unit 305 to be much larger than the size of one pixel with respect to one feature plane. In this example, the pixel count per feature plane is limited to 256 or more in accordance with the minimum size of an object to be recognized. As described above, in this example, to reduce the data size while obtaining the allowable quality of the output result, the first compression processing (down-sampling in the spatial direction) is performed only in layer 2.

The sizes of the feature planes 401 to 404 after the first compression processing by the compression processing unit 801 are 3 KB, 2 KB, 4 KB, and 1 KB, respectively. Therefore, to calculate feature planes 403 using the feature planes 402, at least the feature planes 402 or 403 are further compressed so that the feature planes 402 and 403 (6 KB in total) after the first compression processing are stored in the storage unit 803 (5 KB). On the other hand, if the pixel count is further reduced, the accuracy of postprocessing may become unallowable. Thus, in this embodiment, the compression processing unit 802 further compresses at least the feature planes 402 or 403.

Next, a method of determining the compression ratio of the second compression processing by the compression processing unit 802 will be described next. In this example, the compression processing unit 802 reduces the data size to 2 KB by compressing the bit width of each feature plane 403 from 8 to 4. In this way, by using both the compression processing units 801 and 802 using different redundancies, it is expected to suppress deterioration of the quality of the output result of the neural network, as compared with a case in which the compression processing unit 801 further reduces the pixel count of each feature plane.

FIG. 11 shows network information and a memory use amount when compressing each feature plane, as described above. Since the upper limit of the memory use amount when processing the network shown in FIG. 4A is 5 KB obtained when calculating the feature planes 402 from the feature planes 401, the network shown in FIG. 4A can be processed using the storage unit 803.

Similar to the first embodiment, it is possible to set information necessary for compression of the feature planes as the control parameters 805 based on the network information shown in FIG. 11. For example, the control parameters 805 can be set to indicate that the compression processing unit 801 performs down-sampling in the spatial direction only in layer 2 and performs no down-sampling in the remaining layers. The control parameters 805 can be set so that the compression processing unit 802 reduces the quantization bit width to 4 only for layer 3 and does not reduce the bit width (sets the bit width to 8) for the remaining layers. The control unit 804 can switch control signals for each layer based on the control parameters 805, similar to the control unit 104 in the first embodiment. The compression processing units 801 and 802 compress the feature plane block in accordance with the given control signals.

As described above, in the second embodiment, not only the memory use amount but also the calculation amount is reduced by compressing the feature planes. The number of product-sum operations performed to calculate the feature planes of each layer is proportional to the number of input feature planes, the number of output feature planes, and the pixel count per output feature plane before compression. In the above example, the calculation unit 806 calculates the feature planes of layer 2 in which the pixel count per feature plane is 1,024, and then the compression processing unit 801 compresses the feature planes so that the pixel count per feature plane is 256. The calculation unit 806 calculates feature planes of layers 3 and 4 in which the pixel count per feature plane is 256. Therefore, in the above example, the number of product-sum operations necessary to calculate the feature planes of layers 3 and 4 is reduced to ¼ that before compression.

Further Embodiments

In each of the first and second embodiments, the data processing unit 305 includes the two compression processing units 101 and 102 or 801 and 802. On the other hand, the data processing unit 305 may include three or more compression processing units that perform different types of compression processes, respectively.

Furthermore, in each of the first and second embodiments, some specific compression processes are used. However, a combination of compression processes to be used is not particularly limited. An example of usable compression processing is compression processing on a data array in the spatial direction. In this case, similar to the compression processing unit 102 or 801, it is possible to perform compression using information of the spatial direction (for example, redundancy in the spatial direction). Another example of usable compression processing is a method of reducing the bit width of a value. For example, a compression processing unit similar to the compression processing unit 101 or 802 can be used. Still another example of usable compression processing is compression processing on a data array in a channel direction (the direction of the number of feature planes). In this case, it is possible to perform compression using information of the direction of the number of feature planes (for example, redundancy in the channel direction). For example, the compression processing unit may receive a plurality of feature planes as an input, and perform compression processing similar to that by the compression processing unit 102 for a pixel block (for example, a pixel block formed by pixels of each feature plane at predetermined pixel positions) including pixels in each of the plurality of feature planes. Similar to the compression processing unit 801, the compression processing unit may execute compression processing of reducing the number of feature planes by performing down-sampling.

As described above, the first and second compression processes may be two of compression processing (spatial compression) for a data array in the spatial direction, compression processing (inter-channel compression) for a data array in the channel direction, and processing of reducing the bit width of a value. At least one of the first and second compression processes may be compression processing on a data array in the spatial direction or the channel direction. In this case, at least one of the first and second control signals corresponding to this compression processing may define processing parameters of the compression processing on the data array. Furthermore, at least one of the first and second compression processes may be processing of reducing the bit width of a value. In this case, at least one of the first and second control signals corresponding to this compression processing may designate the reduction amount of the bit width or a bit width after reduction.

The size of the feature plane block used in each of the first and second embodiments is merely an example, and is not particularly limited. The size of the feature plane block may be an arbitrary size that satisfies the constraint condition of input data to each of the compression processing units 101, 102, 801, and 802.

The connection order of the compression processing units 101 and 102 according to the first embodiment and that of the compression processing units 801 and 802 according to the second embodiment may be changed. The control unit 104 or 804 may output a control signal that designates a processing order by the respective compression processing units in accordance with the control parameters 105 or 805. In this case, the data compression apparatus can be formed so as to switch connection paths between the compression processing units.

In the second embodiment, the decompression processing is omitted. However, the decompression processing may be performed. Similarly, if calculation processing can be performed without executing decompression processes corresponding a plurality of compression processes, the decompression processing may be performed. In this case, the decompression processing unit can perform processing of increasing the data size of each compressed feature plane. For example, the decompression processing unit can perform processing of increasing the pixel count for the feature plane having undergone down-sampling in the spatial direction as in the second embodiment. In addition, if down-sampling is performed to reduce the number of feature planes, the decompression processing unit can perform processing of increasing the feature planes by copying some or all of the feature planes.

In one embodiment, each of the plurality of compression processing units performs fixed-length compression for the feature planes of one layer. That is, the data size of each feature plane compressed by the plurality of compression processing units is a fixed length regardless of input data to the data processing unit 305. In this arrangement, similar to the compression processing units 101 and 102 or 801 and 802 according to the first or second embodiment, each of the plurality of compression processing units may perform fixed-length compression. On the other hand, in this arrangement, each of the plurality of compression processing units need not perform fixed-length compression, and each compression processing may be set so that the plurality of compression processing units cooperatively perform fixed-length compression.

The first and second control signals output from the control unit 104 or 804 may be signals determined in accordance with the target quality of data obtained by processing using a neural network. For example, in each of the first and second embodiments, the control parameters 105 or 805 are determined so that the quality of the output result of the neural network is as high as possible in accordance with the constraint that the feature planes can be stored in the memory of the storage unit 103 or 803. On the other hand, the control parameters 105 or 805 may be determined so that the memory use amount of the storage unit 103 or 803 is as small as possible in accordance with the constraint that the quality of the output result of the neural network is allowable. Furthermore, to determine the control parameters, knowledge about the influence of compression of the feature planes on the recognition accuracy of the neural network can be used instead of the methods described in the first and second embodiments. For example, different compression processes can be applied to the input, intermediate, and output layers, respectively, in consideration of the difference in properties of the feature planes.

In each of the first and second embodiments, the control parameters 105 or 805 are provided in advance. If processing using a specific neural network is performed in various devices, the user can determine the control parameters 105 or 805 based on the memory capacity of each device, the target quality, or the like. In this embodiment, since it is not necessary to modify the structure of the neural network, processing control according to each device is easy. On the other hand, the control parameters 105 or 805 may be calculated automatically. For example, the control unit 104 or 804 can determine the control parameters 105 or 805 based on information indicating the memory capacity of each device, the target quality, or the like, and network information of the neural network. The control unit 104 or 804 may calculate the control parameters 105 or 805 in accordance with the method described in the first or second embodiment immediately before, for example, step S203.

In each of the first and second embodiments, the control unit 104, 804 switches the control signals to be output for each layer. On the other hand, the control unit 104, 804 may switch the control signals to be output for each feature plane block. In this case, the control unit 104, 804 may switch the control signals immediately before step S205 or S207.

In each of the first and second embodiments, the calculation unit 106 or 806 performs processing using the activation function $\phi$ in accordance with equation (1). However, processing corresponding to the activation function $\phi$ may be performed by a processing unit other than the calculation unit 106. For example, the calculation unit 106 or 806 may perform only a product-sum operation, and one of the compression processing units may perform the processing corresponding to the activation function $\phi$.

The network shown in FIGS. 4A and 4B is merely an example, and the type of the network to be used is not particularly limited. For example, the neural network used by the data processing apparatus may include pooling processing that may be used in a convolution neural network. In this case, the calculation unit 106 or 806 may perform the pooling processing in, for example, step S205. The data processing unit 305 may include another processing unit that performs the pooling processing. Furthermore, the compression processing unit 801 according to the second embodiment can also be used as a processing unit that performs pooling. One of the plurality of compression processing units may perform the pooling processing in, for example, step S204.

In each of the first and second embodiments, the data processing unit 305 is implemented by dedicated hardware shown in FIG. 1 or 8. On the other hand, the processing using the network by the data processing unit 305 may be implemented by software. For example, the processing shown in FIG. 2 may be implemented by a computer including a processor and a memory, such as the data processing apparatus shown in FIG. 3. In this case, a program for implementing the function of each unit, stored in a storage medium such as the ROM 307, is read out into a memory such as the RAM 308. Then, when a processor such as the CPU 306 operates in accordance with the program on the memory, the function of each unit is implemented.

Note that the filter coefficient used for the calculation processing using the neural network can be determined in advance by training. That is, training of the neural network can be performed using output data obtained by performing calculating processing using the neural network for input data for training and supervisory data corresponding to the input data for training. For example, in training, image recognition is performed for a plurality of moving image data and the filter coefficient can be updated every time in accordance with a recognition result. The supervisory data is data indicating a correct answer expected to be obtained by calculation processing on the input data, and can be prepared in advance. A practical filter coefficient determination method is not particularly limited. For example, error back-propagation is adopted. The data processing apparatus may include a training unit (not shown) that performs such training.

As in each of the first and second embodiments, if there is provided an arrangement of performing the first and second compression processes for the feature plane data stored in the storage unit 103 or 803, training can be performed as follows. That is, the training unit can acquire output data obtained by performing calculation processing using the neural network for the input data for training while performing the first and second compression processes corresponding to the layer. The training unit can perform training of the neural network using the output data and the supervisory data corresponding to the input data for training. As described above, the filter coefficient can be obtained in consideration of the influence of a compression error by performing training of the network shown in FIG. 4A including compression processing (and decompression processing, as needed). It is, therefore, possible to reduce deterioration of the quality of the output result of the neural network caused by the compression error.

The processing performed by the data processing apparatus as in each of the first and second embodiments is defined by the control parameters 105 or 805 that specify the first and second compression processes for each layer and the neural network specified by the thus obtained filter coefficient. Therefore, a trained model including the control parameters 105 or 805 and the neural network is also incorporated in the scope of the present invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-044190, filed Mar. 11, 2019, which is hereby incorporated by reference herein in its entirety.

What is claimed is:

1. A data processing apparatus comprising:
one or more processors; and
one or more memories coupled to the one or more processors, the one or more memories having stored thereon instructions which, when executed by the one or more processors, cause the apparatus to:
acquire feature plane data of a layer in a neural network;
output a first control signal corresponding to the layer for controlling first compression processing and a second control signal corresponding to the layer for controlling second compression processing;
perform the first compression processing corresponding to the first control signal on the feature plane data; and
perform the second compression processing corresponding to the second control signal on the feature plane data on which the first compression processing has been performed, wherein a type of processing of the second compression processing is different from the first compression processing.

2. The data processing apparatus according to claim 1, wherein in each of the first compression processing and the second compression processing, fixed-length compression is performed on the feature plane data.

3. The data processing apparatus according to claim 2, wherein the first control signal and the second control signal are output so as to control, for each layer, a data size obtained by the fixed-length compression.

4. The data processing apparatus according to claim 1, wherein the first compression processing is one of compression processing on a data array in a spatial direction and processing of reducing a bit width of a value, and the second compression processing is another one of the compression processing on the data array in the spatial direction and the processing of reducing the bit width of the value.

5. The data processing apparatus according to claim 1, wherein
at least one of the first compression processing or the second compression processing is compression processing on a data array in one of a spatial direction and a channel direction, and
at least one of the first control signal or the second control signal defines a processing parameter of the compression processing on the data array.

6. The data processing apparatus according to claim 5, wherein the compression processing on the data array includes processing of dividing the data array into a plurality of divided data, processing of removing a part of divided data of the plurality of divided data, and processing of generating information indicating a position of the removed divided data in the data array.

7. The data processing apparatus according to claim 1, wherein
at least one of the first compression processing or the second compression processing is processing of reducing a bit width of a value, and
the first control signal or the second control signal, which corresponds to the processing of reducing the bit width of the value, designates a reduction amount of the bit width or a bit width after reduction.

8. The data processing apparatus according to claim 1, wherein at least one of the first compression processing or the second compression processing is lossy compression processing.

9. The data processing apparatus according to claim 1, wherein the first control signal is used to control, for each layer, whether to perform the first compression processing, and the second control signal is used to control, for each layer, whether to perform the second compression processing.

10. The data processing apparatus according to claim 1, wherein the first compression processing and the second compression processing are performed, respectively, for each of a plurality of processing units obtained by dividing the feature plane data.

11. The data processing apparatus according to claim 1, wherein the first control signal and the second control signal are determined based on a size of each feature plane of the layer, a number of feature planes of the layer, and a bit width of each feature plane of the layer.

12. The data processing apparatus according to claim 1, wherein the instructions, when executed by the one or more processors, further cause the apparatus to:
store compressed feature plane data in the one or more memories; and
determine the first control signal and the second control signal based on a capacity of the one or more memories.

13. The data processing apparatus according to claim 1, wherein the first control signal and the second control signal are determined in accordance with target quality of data to be obtained by processing using the neural network.

14. The data processing apparatus according to claim 1, wherein the instructions, when executed by the one or more processors, further cause the apparatus to:
store compressed feature plane data obtained by the second compression processing in the one or more memories; and perform calculation processing using the neural network through generating feature plane data of a next layer using the compressed feature plane data of a previous layer stored in the one or more memories.

15. The data processing apparatus according to claim 14, wherein the instructions, when executed by the one or more processors, further cause the apparatus
to decompress compressed feature plane data stored in the one or more memories and supply the decompressed feature plane data to the calculation processing.

16. The data processing apparatus according to claim 15, wherein the instructions, when executed by the one or more processors, further cause the apparatus to select decompression processing for each layer.

17. The data processing apparatus according to claim 14, wherein the instructions, when executed by the one or more processors, further cause the apparatus to:
generate output data corresponding to input data by performing calculation processing using the neural network on the input data, and
perform training of the neural network using output data obtained by performing the calculation processing using the neural network on input data for training as well as supervisory data corresponding to the input data for training.

18. A trained model comprising:
a filter coefficient which specifies a neural network to acquire feature plane data of a layer in the neural network; and
for the layer in the neural network,
a first control parameter which causes a data processing apparatus to output a first control signal corresponding to the layer for controlling first compression processing performed on the feature plane data of the layer, and
a second control parameter which causes the data processing apparatus to output a second control signal corresponding to the layer for controlling second compression processing performed on the feature plane data of the layer on which the first compression processing has been performed, wherein a type of processing of the second compression processing is different from the first compression processing.

19. A data processing method comprising:
acquiring feature plane data of a layer in a neural network;
outputting a first control signal corresponding to the layer for controlling first compression processing and a second control signal corresponding to the layer for controlling second compression processing;
performing the first compression processing corresponding to the first control signal on the feature plane data; and
performing the second compression processing corresponding to the second control signal on the feature plane data on which the first compression processing has been performed, wherein a type of processing of the second compression processing is different from the first compression processing.

20. A non-transitory computer-readable medium storing a program which, when executed by a computer comprising a processor and a memory, causes the computer to:
acquire feature plane data of a layer in a neural network;
output a first control signal corresponding to the layer for controlling first compression processing and a second control signal corresponding to the layer for controlling second compression processing;
perform the first compression processing corresponding to the first control signal on the feature plane data; and
perform the second compression processing corresponding to the second control signal on the feature plane data on which the first compression processing has been performed, wherein a type of processing of the second compression processing is different from the first compression processing.

* * * * *